United States Patent
Hsu et al.

(10) Patent No.: US 10,043,712 B1
(45) Date of Patent: Aug. 7, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Meng-Fang Hsu, Hsinchu (TW); Pei-Lin Wu, Kaohsiung (TW); Chun-Sheng Liang, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/597,244

(22) Filed: May 17, 2017

(51) Int. Cl.
*H01L 21/8234* (2006.01)
*H01L 27/088* (2006.01)
*H01L 29/06* (2006.01)
*H01L 29/49* (2006.01)
*H01L 29/66* (2006.01)

(52) U.S. Cl.
CPC ........ *H01L 21/823437* (2013.01); *H01L 21/823431* (2013.01); *H01L 21/823468* (2013.01); *H01L 21/823481* (2013.01); *H01L 27/0886* (2013.01); *H01L 29/0649* (2013.01); *H01L 29/4983* (2013.01); *H01L 29/66545* (2013.01)

(58) Field of Classification Search
CPC ....... H01L 21/823437; H01L 29/66545; H01L 21/823481; H01L 21/823468; H01L 29/4983; H01L 29/0649; H01L 29/0886; H01L 21/823431
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,846,491 | B1 * | 9/2014 | Pham ............... H01L 21/76224 257/E21.409 |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,171,852 | B2 * | 10/2015 | Tsuda ............... H01L 27/11521 |
| 9,236,267 | B2 | 1/2016 | De et al. |
| 9,245,805 | B2 | 1/2016 | Yeh et al. |
| 9,412,616 | B1 * | 8/2016 | Xie ................... H01L 21/76224 |
| 9,490,176 | B2 * | 11/2016 | Chang ............ H01L 21/823481 |
| 9,520,482 | B1 | 12/2016 | Chang et al. |
| 9,543,298 | B1 * | 1/2017 | Zang .................. H01L 27/0886 |
| 9,576,814 | B2 | 2/2017 | Wu et al. |
| 9,589,845 | B1 * | 3/2017 | Jagannathan ... H01L 21/823431 |
| 9,601,567 | B1 * | 3/2017 | Hsieh ................... H01L 29/785 |

(Continued)

*Primary Examiner* — William Coleman
(74) *Attorney, Agent, or Firm* — McClure, Qualey & Rodack, LLP

(57) ABSTRACT

A semiconductor structure includes a substrate, at least two gate spacers, a gate stack, an insulating structure, and at least one sacrificial layer. The substrate has at least one semiconductor fin. The gate spacers are disposed on the substrate. The gate stack is disposed between the gate spacers and covers the semiconductor fin. The insulating structure is disposed between the gate spacers and adjacent to the gate stack. The sacrificial layer is disposed between at least one of the gate spacers and the insulating structure.

20 Claims, 9 Drawing Sheets

(56) References Cited

U.S. PATENT DOCUMENTS

| | | | | |
|---|---|---|---|---|
| 9,627,379 B1* | 4/2017 | Chang | ............ | H01L 27/0886 |
| 9,659,930 B1* | 5/2017 | Yu | ............ | H01L 27/0886 |
| 2016/0093511 A1* | 3/2016 | Sengupta | ............ | H01L 21/32139 |
| | | | | 257/401 |
| 2016/0254180 A1* | 9/2016 | Liu | ............ | H01L 27/0924 |
| | | | | 257/369 |
| 2017/0236933 A1* | 8/2017 | Basker | ............ | H01L 29/785 |
| | | | | 257/401 |

* cited by examiner

SEMICONDUCTOR STRUCTURE AND MANUFACTURING METHOD THEREOF

BACKGROUND

Double-gate metal-oxide-semiconductor field-effect transistors (MOSFETs) are MOSFETs that incorporate two gates into one device. These devices are also called fin-shaped field effect transistors (FinFETs) due to their structure including a thin "fin" extending from a substrate. Silicon based FinFETs can be fabricated using MOSFET technology. A FinFET is fabricated on a substrate with an overlying insulating layer with a thin "fin" extending from the substrate, for example, etched into a silicon layer of the substrate. The channel of the field effect transistor (FET) is formed in this vertical fin. A gate is provided over (e.g., wrapping) the fin. The double gate is beneficial in that there is a gate on both sides of the channel allowing gate control of the channel from both sides. FinFETs further reduce the short channel effect and have high current flow. Other FinFET architectures may include three or more effective gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 8A are top views of a method for manufacturing a semiconductor structure at various stages in accordance with some embodiments of the presented disclosure.

FIGS. 1B to 8B are cross-sectional views respectively taking along line B-B of FIGS. 1A to 8A.

DETAILED DESCRIPTION

Figure 1A:
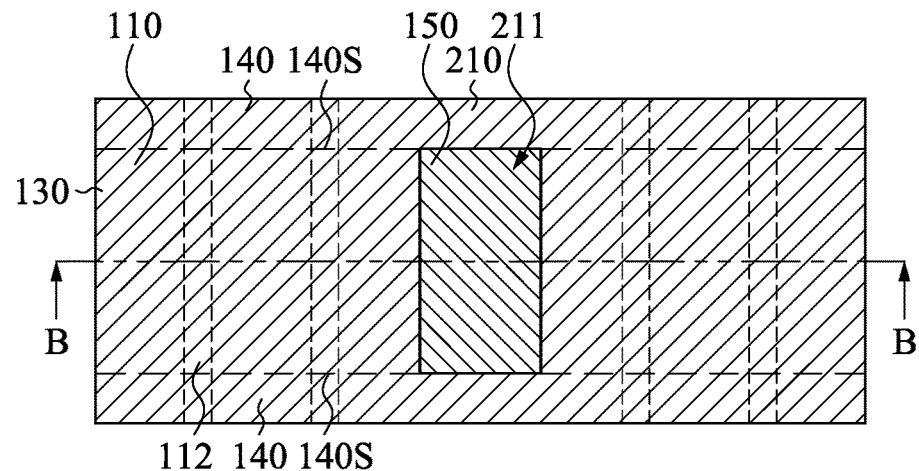

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 8A are top views of a method for manufacturing a semiconductor structure 100 at various stages in accordance with some embodiments of the presented disclosure. FIGS. 1B to 8B are cross-sectional views respectively taking along line B-B of FIGS. 1A to 8A. Reference is made to FIG. 1A and FIG. 1B. A substrate 110 is provided. The substrate 110 includes semiconductor fins 112 protruded from a top surface of the substrate 110. In some embodiments, the semiconductor fins 112 include silicon. It is note that the numbers of the semiconductor fins 112 in FIGS. 1A and 1B are illustrative, and should not limit the claimed scope of the presented disclosure. A person having ordinary skill in the art may select suitable numbers for the semiconductor fins 112 according to actual situations.

In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the substrate 110 may be an active layer of a semiconductor-on-insulator (SOI) substrate or a multi-layered structure such as a silicon-germanium layer formed on a bulk silicon layer.

The semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 112 may be epitaxially grown. For example, exposed portions of an underlying material, such as an exposed portion of the substrate 110, may be used in an epitaxial process to form the semiconductor fins 112. A mask may be used to control the shape of the semiconductor fins 112 during the epitaxial growth process.

Figure 1B:
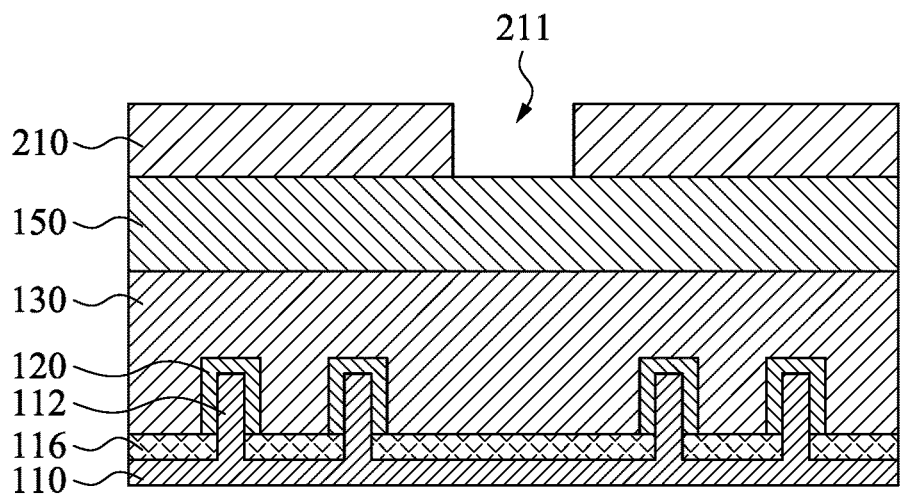

In FIG. 1B, a plurality of isolation structures 116 are formed on the substrate 110. The isolation structures 116, which act as shallow trench isolations (STIs) around the semiconductor fins 112, may be formed by chemical vapor deposition (CVD) techniques using tetra-ethyl-ortho-silicate (TEOS) and oxygen as a precursor. In some other embodiments, the isolation structures 116 may be formed by implanting ions, such as oxygen, nitrogen, carbon, or the like, into the substrate 110. In yet some other embodiments, the isolation structures 116 are insulator layers of a SOI wafer.

An interfacial layer 120 is formed on the semiconductor fins 112. The interfacial layer 120, which prevents electron depletion, may include, for example, a high-κ dielectric material such as metal oxides. Some embodiments may include hafnium oxide ($HfO_2$) hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The interfacial layer 120 may have a multilayer structure such as one layer of silicon oxide (e.g., interfacial layer) and another layer of high-κ material. The interfacial layer 120 may have a thickness in a range from about 2 nm to about 10 nm. The interfacial layer 120 may be formed using CVD, physical vapor deposition (PVD), atomic layer deposition (ALD), thermal oxide, ozone oxidation, other suitable processes, or combinations thereof.

A dummy gate layer 130 is formed on the substrate 110 and covers the interfacial layer 120 and the semiconductor fins 112. In other words, the interfacial layer 120 is disposed between the dummy gate layer 130 and the semiconductor fins 112 of the substrate 110. In some embodiments, the dummy gate layer 130 includes a semiconductor material such as polysilicon, amorphous silicon, or the like. The dummy gate layer 130 may be deposited doped or undoped. For example, in some embodiments, the dummy gate layer 130 includes polysilicon deposited undoped by low-pressure chemical vapor deposition (LPCVD). The polysilicon may also be deposited, for example, by furnace deposition of an in-situ doped polysilicon. Alternatively, the dummy gate layer 130 may include other suitable materials.

A hard mask 150 is formed over the dummy gate layer 130 and the semiconductor fin 112. The hard mask 150 may include, for example, silicon dioxide ($SiO_2$), silicon nitride (SiN), oxynitrides (SiON), silicon carbide (SiC), aluminum oxide ($Al_2O_3$). The hard mask 150 may be formed using chemical vapor deposition (CVD), physical vapor deposition (PVD), other suitable processes, or combinations thereof.

A plurality of gate spacers 140 are formed on the substrate 110. At least one of the gate spacers 140 has a sidewall 140s facing another of the gate spacers 140, and the gate spacers 140 are formed on opposing sides of the dummy gate layer 130. In some embodiments, at least one of the gate spacers 140 includes single or multiple layers. The gate spacers 140 can be formed by blanket depositing one or more dielectric layer(s) (not shown) on the previously formed structure. The dielectric layer(s) may include silicon nitride (SiN), oxynitride, silicion carbon (SiC), silicon oxynitride (SiON), oxide, and the like and may be formed by methods utilized to form such a layer, such as CVD, plasma enhanced CVD, sputter, and other methods known in the art. The gate spacers 140 may also be a spin-on glass formed using spin-on coating. For example, the gate spacers 140 may include phosphosilicate glass (PSG), boro-silicate glass (BSG), boron-doped phospho-silicate glass (BPSG), tetraethyl orthosilicate (TEOS) oxide, TiN, SiOC, or other low-k non-porous dielectric materials. The gate spacers 140 may include different materials with different etch characteristics than the dummy gate layer 130 so that the gate spacers 140 may be used as masks for the patterning of the dummy gate layer 130.

A photoresist 210 is formed on the hard mask 150. The photoresist 210 is applied onto the hard mask 150 by, for example, spin coating. The photoresist 210 is then prebaked to drive off excess photoresist solvent. After prebaking, the photoresist 210 is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between a final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer.

After the development, at least one opening 211 is formed in the photoresist 210 to expose the hard mask 150. The remaining photoresist 210 is then hard-baked to solidify the remaining photoresist 210.

Figure 2A:
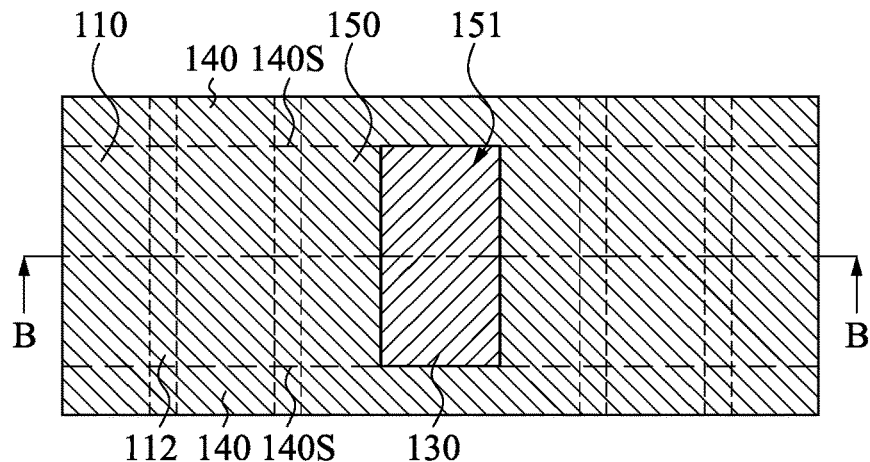
Figure 2B:
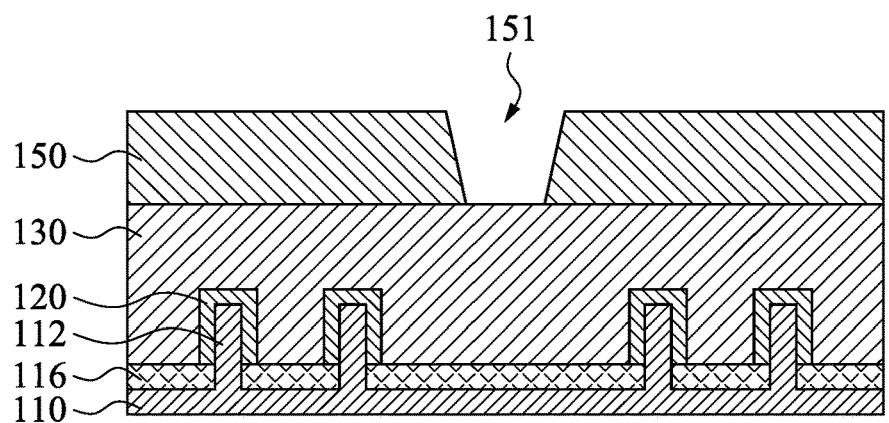

Reference is made to FIG. 2A and FIG. 2B. Portions of the hard mask 150 which are not protected by the remaining photoresist 210 are etched to form an opening 151 exposing the dummy gate layer 130. The etching of the hard mask 150 may be dry etching, such as reactive ion etching (RIE), plasma enhanced (PE) etching, or inductively coupled plasma (ICP) etching. In some embodiments, when the hard mask 150 is made of silicon oxide, fluorine-based RIE can be used to form the opening 151. The gas etchant used to dry etch the hard mask 150 is, for example, $CF_4/O_2$.

After the opening 151 is formed, the photoresist 210 (see FIG. 1B) is removed from the hard mask 150 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist 210 from the hard mask 150.

Figure 3A:
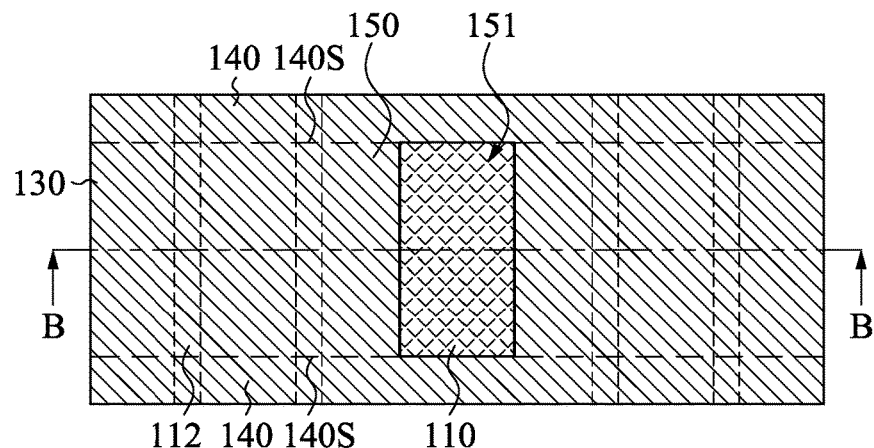
Figure 3B:
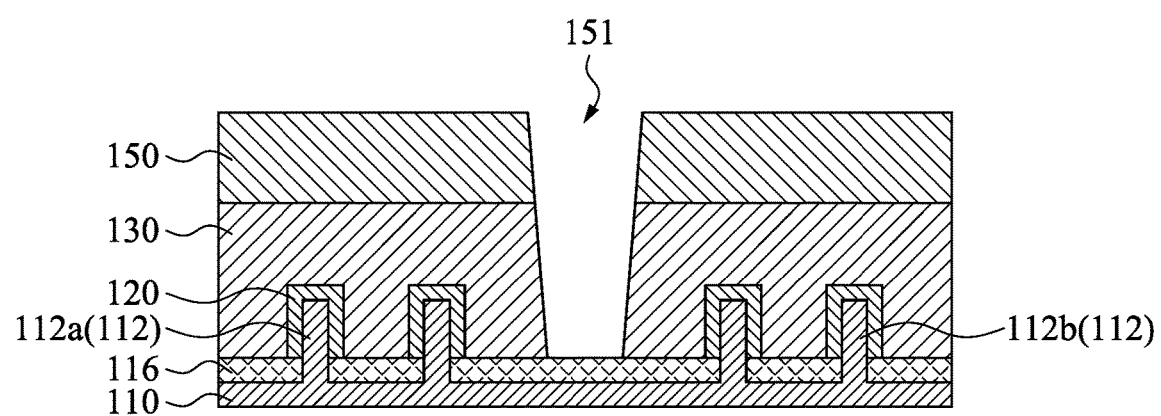

Reference is made to FIG. 3A and FIG. 3B. The dummy gate layer 130 is partially removed (or patterned) in the regions exposed by the hard mask 150 by an etching back process or other suitable process. Therefore, the opening 151 is extended and exposes the isolation structures 116. The opening 151 is formed between the semiconductor fins 112a and the semiconductor fins 112b and between the gate spacers 140. The portion of the dummy gate layer 130 exposed by the hard mask 150 may be removed by a wet etch process that includes exposure to hydroxide containing solution (e.g., ammonium hydroxide), deionized water, and/or other suitable etchant solutions.

Figure 4A:
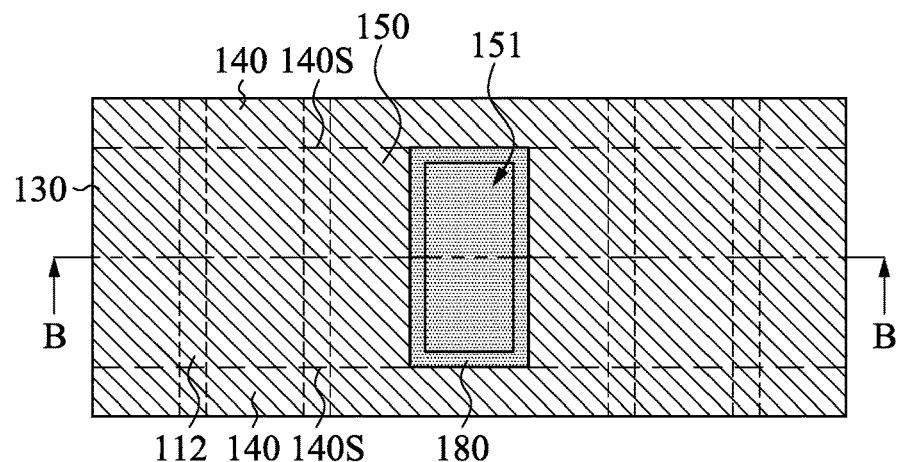
Figure 4B:
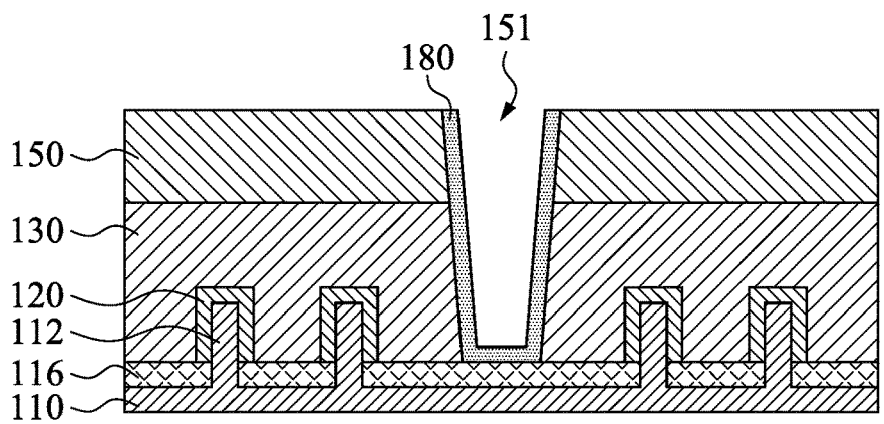

Reference is made to FIG. 4A and FIG. 4B. A sacrificial layer 180 is formed on sidewalls of the opening 151. Therefore, the sacrificial layer 180 is formed on the hard mask 150, the dummy gate layer 130, the gate spacers 140, and the substrate 110. The sacrificial layer 180 is made of silicon dioxide or other suitable materials. The thickness of the sacrificial layer 180 may be in a range from about 1 nm to about 2 nm. The sacrificial layer 180 is formed by atomic layer deposition or other suitable processes.

Figure 5A:
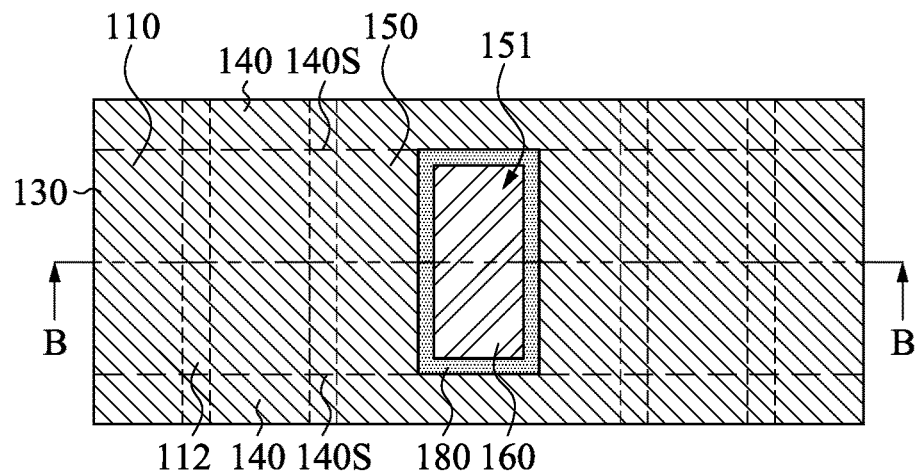
Figure 5B:
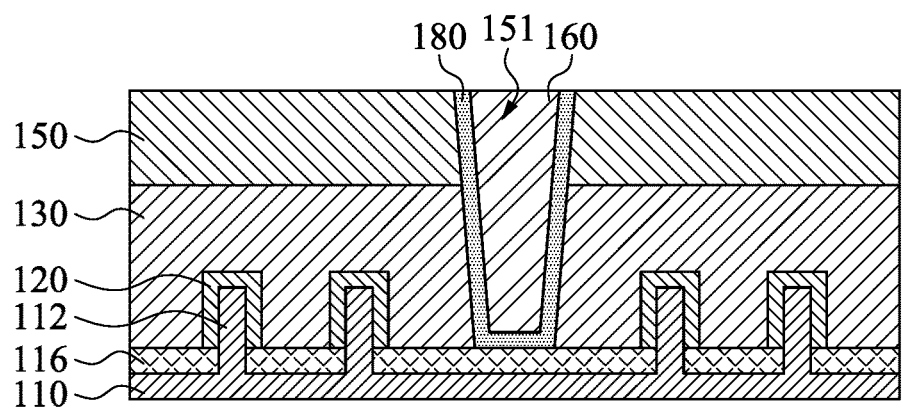

Reference is made to FIG. 5A and FIG. 5B. An insulating structure 160 is formed in the opening 151 and on the sacrificial layer 180. The insulating structure 160 may be a plug which is surrounded by the gate spacers 140 and the dummy gate layer 130. For example, an inter-layer dielectric (ILD) (not shown) is formed over the hard mask 150 and in the opening 151. A chemical mechanical planarization (CMP) process may then be performed to etch back and planarize the ILD to form the insulating structure 160. In some embodiments, the ILD is made of silicon nitride or silicon oxynitride.

Figure 6A:
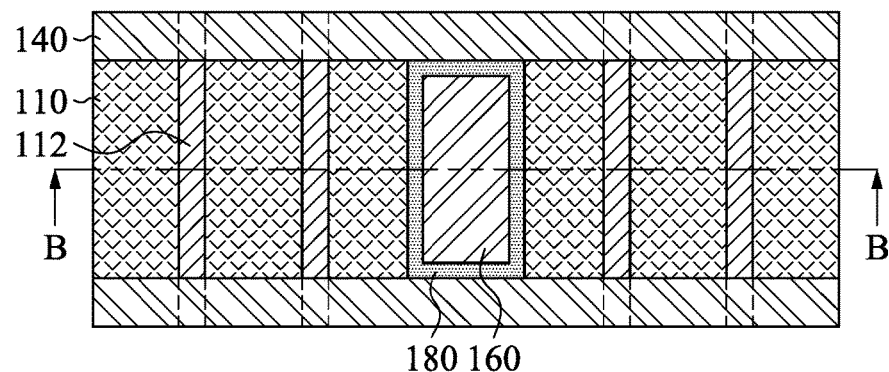
Figure 6B:
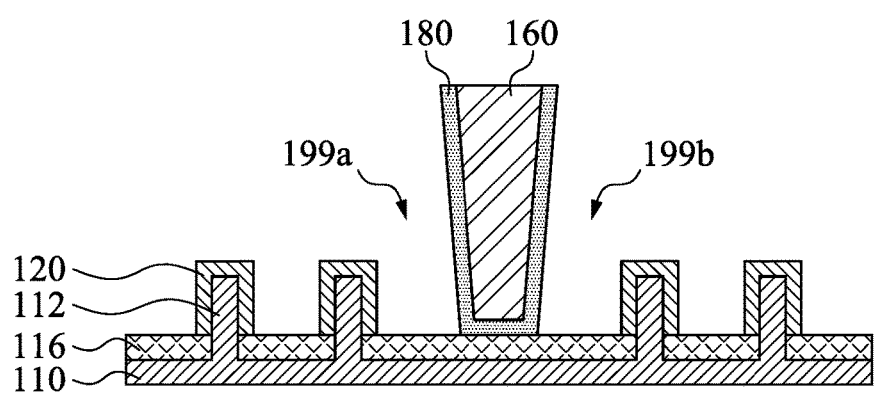

Reference is made to FIG. 6A and FIG. 6B. For clarity, the interfacial layer 120 is illustrated in FIG. 6B and is omitted in FIG. 6A. The hard mask 150 (see FIG. 5B) is removed, and then the dummy gate layer 130 (see FIG. 5B) is removed. Therefore, an opening 199a and an opening 199b are formed. The opening 199a and the opening 199b are formed on two opposite sides of the insulating structure 160. The removing process may include a dry etching process, a wet etching process, and/or combinations thereof. The removing process may also include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, NF3, SF6, and He. Dry etching may also be performed anisotropically using such mechanisms as DRIE (deep reactive-ion etching).

Figure 7A:
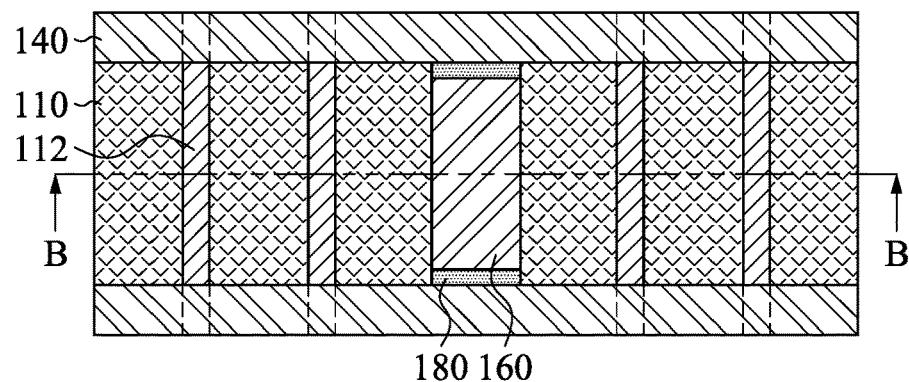
Figure 7B:
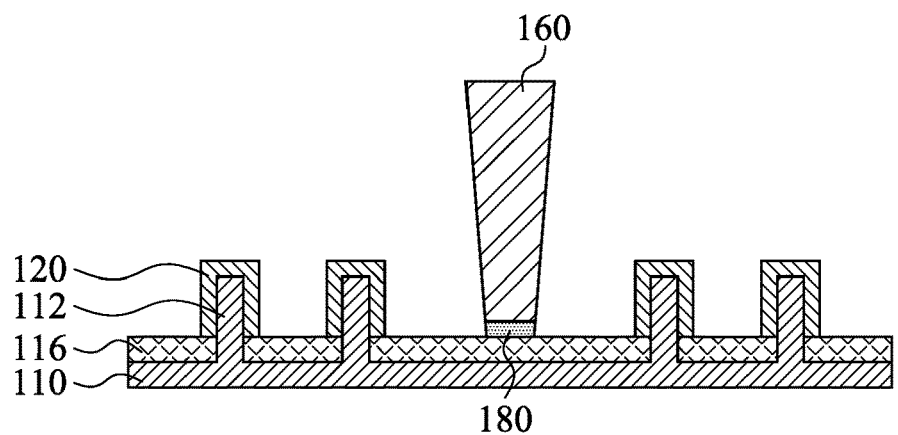

Reference is made to FIG. 7A and FIG. 7B. The sacrificial layer 180 on the sidewalls of the insulating structure 160 and the interfacial layer 120 (see FIG. 6B) covering the semiconductor fins 112 are removed. The interfacial layer 120 and the sacrificial layer 180 may be removed by selective wet etching or plasma etching. In some embodiments, the interfacial layer 120 and the sacrificial layer 180 are removed in one etching process. In some other embodiments, however, the interfacial layer 120 and the sacrificial layer 180 are removed in different etching processes.

Because the area of the exposed part of the sacrificial layer 180 disposed between the gate spacers 140 and the insulating structure 160 is small, the part of the sacrificial layer 180 disposed between the gate spacers 140 and the insulating structure 160 is not removed when the interfacial layer 120 and the sacrificial layer 180 on the sidewalls of the insulating structure 160 are removed. In addition, the part of the sacrificial layer 180 disposed between the insulating structure 160 and the isolation structure 116 is not removed as well when the interfacial layer 120 and the sacrificial layer 180 on the sidewalls of the insulating structure 160 are removed.

Figure 8A:
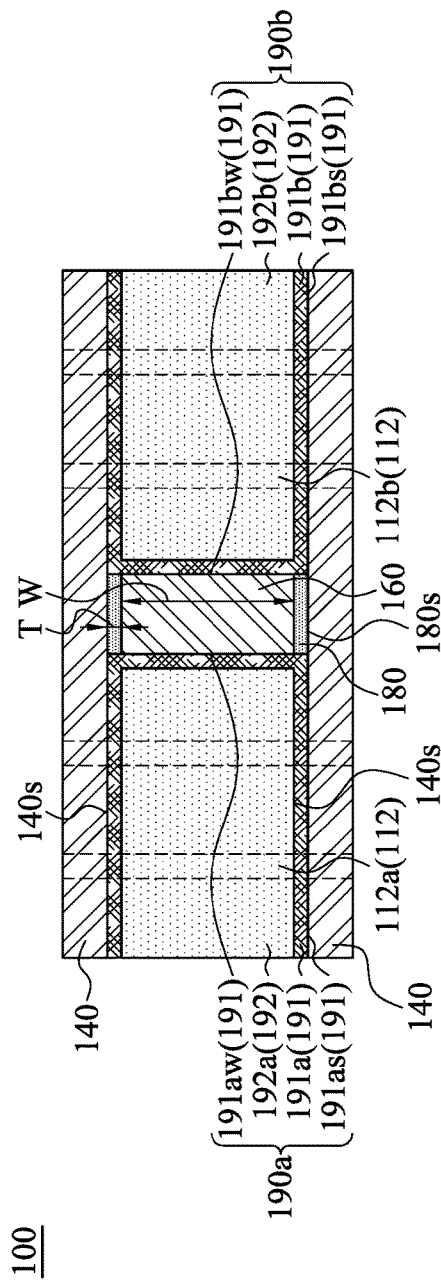
Figure 8B:
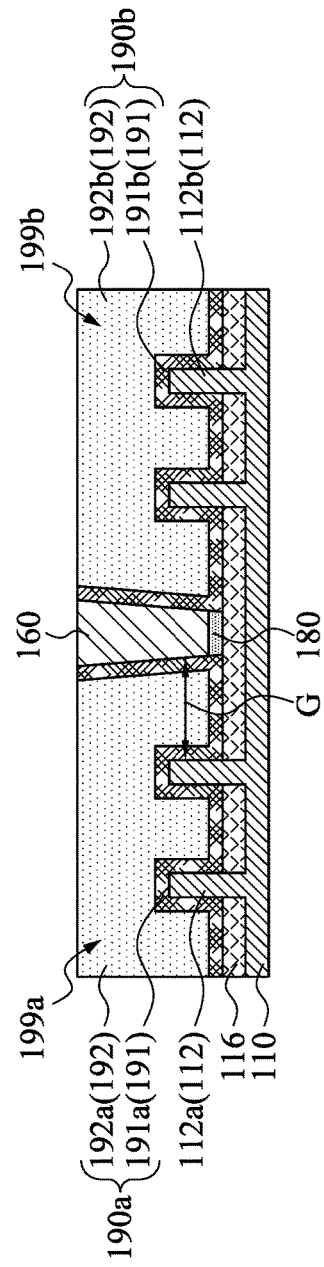

Reference is made to FIG. 8A and FIG. 8B. A gate stack 190a and a gate stack 190b are respectively formed in the opening 199a and the opening 199b to respectively cover the semiconductor fin 112a and the semiconductor fin 112b.

In some embodiments, a gate dielectric layer 191, a diffusion barrier layer (not shown in Figs.), a metal layer (not shown in Figs.), a block layer (not shown in Figs.), a wetting layer (not shown in Figs.), and a filling metal (not shown in Figs.) are sequentially formed in the opening 199a and 199b. Then, a planarization step (for example, chemical mechanical polish (CMP)) is performed to remove excess portions of the gate dielectric layer 191, the diffusion barrier layer, the metal layer, the block layer, the wetting layer, and the filling metal. The planarization step also remove upper portions of the gate spacers 140, the insulating structure 160, and the sacrificial layer 180. Therefore, the remaining portions of the diffusion barrier layer, the metal layer, the block layer, the wetting layer, and the filling metal in the opening 199a form a gate electrode 192a, and the remaining portions of the diffusion barrier layer, the metal layer, the block layer, the wetting layer, and the filling metal in the opening 199b form a gate electrode 192b. The remaining portions of the gate dielectric layer 191a and the gate electrode 192a in the opening 199a form the gate stack 190a, and the remaining portions of the gate dielectric layer 191b and the gate electrode 192b in the opening 199b form the gate stack 190b. In other words, the gate stack 190a may include the gate dielectric layer 191a, the diffusion barrier layer, the metal layer, the block layer, the wetting layer, and the filling metal, or the gate stack 190a may include the gate dielectric layer 191a and the gate electrode 192a. The gate stack 190b may include the gate dielectric layer 191b, the diffusion barrier layer, the metal layer, the block layer, the wetting layer, and the filling metal, or the gate stack 190b may include the gate dielectric layer 191b and the gate electrode 192b.

In some embodiments, when the gate dielectric layer 191a and 191b are formed, the gate dielectric layer 191a and 191b cover at least portions of the semiconductor fins 112a and 112b and the sidewall of the insulating structure 160.

In some embodiments, the gate dielectric layer 191a and 191b includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer 191a and 191b may also include a high-κ dielectric layer (the upper part of the gate dielectric layer) including a high-κ dielectric material, such as hafnium oxide, lanthanum oxide, aluminum oxide, or combinations thereof. The dielectric constant (κ-value) of the high-κ dielectric material is higher than about 3.9, and may be higher than about 7, and sometimes as high as about 21 or higher. The high-κ dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer), and a TaN layer (the upper part of the diffusion barrier layer) over the TiN layer.

When the gate stacks 190a and 190b form n-type metal-oxide-semiconductor (MOS) devices, the metal layer is in contact with the diffusion barrier layer. For example, in the embodiments in which the diffusion barrier layer includes a TiN layer and a TaN layer, the metal layer may be in physical contact with the TaN layer. In alternative embodiments in which the gate stacks 190a and 190b form p-type metal-oxide-semiconductor (MOS) devices, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed to fully fill the remaining opening O1. The formation of the wetting layer improves the wetting of the filling metal to the underlying layers.

Figure 9:
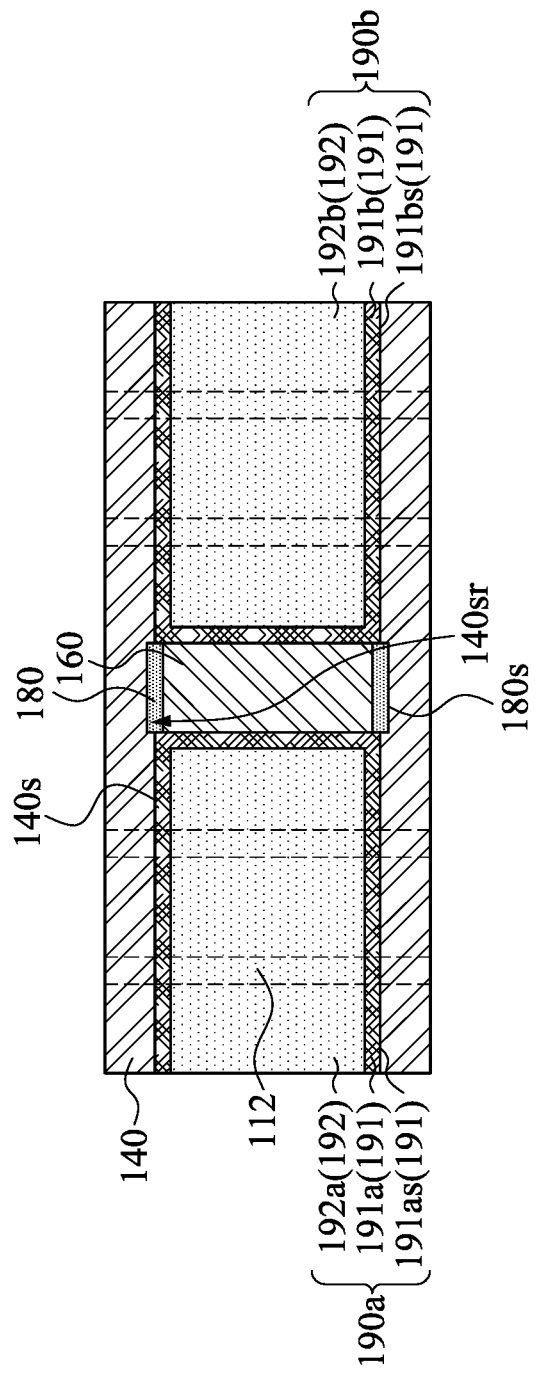
FIG. 9 is a top view of a semiconductor structure in accordance with some embodiments of the presented disclosure.

FIG. 9 is a top view of a semiconductor structure 100 in accordance with some embodiments of the presented disclosure. Reference is made to FIG. 4B and FIG. 9. In some embodiments, when the sacrificial layer 180 is formed on the sidewall of the opening 151, the sacrificial layer 180 is formed by $O_2$ treatment. Therefore, in FIG. 9, at least a part of the sacrificial layer 180 is embedded in the gate spacers 140.

Reference is made to FIG. 8A and FIG. 8B. In another aspect of the present disclosure, a semiconductor structure 100 is provided. The semiconductor structure 100 includes a substrate 110, at least two gate spacers 140, gate stacks 190a and 190b, an insulating structure 160, and at least one sacrificial layer 180. The substrate 110 has at least one semiconductor fin 112a and at least one second semiconductor fin 112b. The gate spacers 140 are disposed on the substrate 110. At least one of the gate spacers 140 has a sidewall 140s facing another of the gate spacers 140. The gate stack 190a is disposed between the gate spacers 140 and covers the semiconductor fin 112a, and the gate stack 190b is disposed between the gate spacers 140 and covers the semiconductor fin 112b. The gate stack 190a includes a gate dielectric layer 191a and a gate electrode 192a. The gate dielectric layer 191a is disposed on the substrate 110 and the sidewall 140s of at least one of the gate spacers 140 and covers at least a portion of the semiconductor fin 112a. The gate electrode 192a is disposed on the gate dielectric layer 191a. The gate stack 190b includes a gate dielectric layer 191b and a gate electrode 192b. The gate dielectric layer 191b is disposed on the substrate 110 and the sidewall 140s of at least one of the gate spacers 140 and covers at least a portion of the semiconductor fin 112b. The gate electrode 192b is disposed on the gate dielectric layer 191b. The insulating structure 160 is disposed between the gate stacks 190a and 190b and between gate spacers 140, and the insulating structure 160 is on a sidewall 191aw of the gate stack 190a and a sidewall 191bw of the gate stack 190b. The sacrificial layer 180 is disposed between at least one of the gate spacer 140 and the insulating structure 160.

In some embodiments, the insulating structure 160 and the sacrificial layer 180 are made of different materials. The insulating structure 160 may be made of silicon nitride or silicon oxynitride. The sacrificial layer 180 may be made of silicon dioxide. Embodiments of this disclosure are not limited thereto. The person having ordinary skill in the art can make proper modifications to the insulating structure 160 and the sacrificial layer 180 depending on the actual application.

In some embodiments, a thickness T of the sacrificial layer 180 is less than a width W of the insulating structure 160. The thickness T of the sacrificial layer 180 may be in a range from about 1 nm to about 2 nm. Embodiments of this disclosure are not limited thereto. The person having ordinary skill in the art can make proper modifications to the insulating structure 160 and the sacrificial layer 180 depending on the actual application.

In some embodiments, the gate spacers 140 and the sacrificial layer 180 are made of different materials. The gate spacers 140 are made of silicon nitride or silicon oxynitride. Embodiments of this disclosure are not limited thereto. The person having ordinary skill in the art can make proper modifications to the gate spacers 140 and the sacrificial layer 180 depending on the actual application.

In some embodiments, the gate dielectric layer 191a has a sidewall 191as in contact with at least one of the gate spacers 140, the sacrificial layer 180 has a sidewall 180s in contact with at least one of the gate spacer 140, and the sidewall 191as of the gate dielectric layer 191a is aligned with the sidewall 180s of the sacrificial layer 180. The gate dielectric layer 191b has a sidewall 191bsin contact with at least one of the gate spacers 140, and the sidewall 191bs of the gate dielectric layer 191b is aligned with the sidewall 180s of the sacrificial layer 180. In other words, the gate stack 190a has the sidewall 190as in contact with at least one of the gate spacers 140, and the sidewall 190as of the gate stack 190a is aligned with the sidewall 180s of the sacrificial layer 180. The gate stack 190b has the sidewall 190bs in contact with at least one of the gate spacers 140, and the sidewall 190bs of the gate stack 190b is aligned with the sidewall 180s of the sacrificial layer 180.

Reference is made to FIG. 9. The sidewall 191as of the gate dielectric layer 191a is misaligned with the sidewall 180s of the sacrificial layer 180. Further, the sidewall 140s of at least one of the gate spacers 140 has a recess 140sr, and a part of the sacrificial layer 180 is disposed in the recess 140sr.

In some embodiments of the present disclosure, since the sacrificial layer 180 is formed and then removed, a gap G (see FIG. 8B) between the insulating structure 160 and the neighboring semiconductor fin 112 becomes greater. Therefore, the gate dielectric layer 191a (191b) and the gate electrode 192a (192b) can be properly formed in the gap G between the insulating structure 160 and the neighboring semiconductor fin 112. In addition, because the gap G between the insulating structure 160 and the neighboring semiconductor fin 112 is greater, the width of the opening 211 of the photoresist 210 (see FIG. 1B) and the width of the opening 151 of the hard mask 150 (see FIG. 2B) can be greater, the situation that some residues of the photoresist 210 and some residues of the hard mask 150 are left can be avoided.

According to some embodiments of the present disclosure, a semiconductor structure includes a substrate, at least two gate spacers, a gate stack, an insulating structure, and at least one sacrificial layer. The substrate has at least one semiconductor fin. The gate spacers are disposed on the substrate. The gate stack is disposed between the gate spacers and covers the semiconductor fin. The insulating structure is disposed between the gate spacers and adjacent to the gate stack. The sacrificial layer is disposed between at least one of the gate spacers and the insulating structure.

According to some embodiments of the present disclosure, a semiconductor structure includes a substrate, at least two gate spacers, a gate stack, an insulating structure, and at least one sacrificial layer. The substrate has at least one semiconductor fin. The gate spacers are disposed on the substrate. At least one of the gate spacers has a sidewall facing another of the gate spacers. The gate stack is disposed between the gate spacers and covers the semiconductor fin. The gate stack includes a gate dielectric layer and a gate electrode. The gate dielectric layer is disposed on the substrate and the sidewall of at least one gate spacer and covers at least a portion of the semiconductor fin. The gate electrode is disposed on the gate dielectric layer. The insulating structure is disposed between the gate spacers and on a sidewall of the gate stack. The sacrificial layer is disposed between at least one of the gate spacers and the insulating structure.

According to some embodiments of the present disclosure, a method for manufacturing a semiconductor structure includes the following operations. An opening is formed in a dummy gate layer and between a first semiconductor fin and a second semiconductor fin of a substrate. A sacrificial layer is formed in the opening. An insulating structure is formed in the opening and on the sacrificial layer. The dummy gate layer is removed to expose at least a portion of the sacrificial layer on at least one sidewall of the insulating structure. The portion of the sacrificial layer is removed. A gate stack is formed to cover the first semiconductor fin and in contact with the at least one sidewall of the insulating structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate having at least one semiconductor fin;
 at least two gate spacers disposed on the substrate;
 a gate stack disposed between the gate spacers and covering the semiconductor fin;
 an insulating structure disposed between the gate spacers and adjacent to the gate stack; and
 at least one sacrificial layer disposed between at least one of the gate spacers and the insulating structure, wherein a thickness of the sacrificial layer is less than a width of the insulating structure.

2. The semiconductor structure of claim 1, wherein the insulating structure and the sacrificial layer are made of different materials.

3. The semiconductor structure of claim 1, wherein the gate spacers and the sacrificial layer are made of different materials.

4. The semiconductor structure of claim 1, wherein the sacrificial layer is made of silicon dioxide.

5. The semiconductor structure of claim 1, wherein the insulating structure is made of silicon nitride or silicon oxynitride.

6. The semiconductor structure of claim 1, wherein the gate spacers are made of silicon nitride or silicon oxynitride.

7. The semiconductor structure of claim 1, wherein the gate stack has a sidewall in contact with one of the gate spacers, the sacrificial layer has a sidewall in contact with the one of the gate spacers, and the sidewall of the gate stack is aligned with the sidewall of the sacrificial layer.

8. The semiconductor structure of claim 1, wherein a sidewall of at least one of the gate spacers in contact with the sacrificial layer has a recess, and a part of the sacrificial layer is disposed in the recess.

9. The semiconductor structure of claim 1, wherein the sacrificial layer is further disposed under the insulating structure.

10. A semiconductor structure, comprising:
a substrate;
at least two gate spacers disposed on the substrate;
a gate stack disposed between the gate spacers and over the substrate, the gate stack comprising:
a gate dielectric layer disposed on the substrate and a sidewall of said at least one gate spacer; and
a gate electrode disposed on the gate dielectric layer;
an insulating structure disposed between the gate spacers and on a sidewall of the gate stack; and
at least one sacrificial layer disposed between said substrate and the insulating structure, wherein a thickness of the sacrificial layer is less than a width of the insulating structure.

11. The semiconductor structure of claim 10, wherein the gate dielectric layer has a sidewall in contact with said at least one gate spacer, the sacrificial layer has a sidewall in contact with said at least one gate spacer, and the sidewall of the gate dielectric layer is aligned with the sidewall of the sacrificial layer.

12. The semiconductor structure of claim 10, wherein the sacrificial layer is separated from the substrate.

13. A method for manufacturing a semiconductor structure, the method comprising:
forming an opening in a gate layer and between a first semiconductor fin and a second semiconductor fin of a substrate;
forming a sacrificial layer in the opening; and
forming an insulating structure in the opening and on the sacrificial layer such that a thickness of the sacrificial layer is less than a width of the insulating structure.

14. The method of claim 13, wherein the sacrificial layer is formed by atomic layer deposition.

15. The method of claim 13, wherein the sacrificial layer is formed by $O_2$ treatment.

16. The method of claim 13, further comprising:
forming an interfacial layer on the first semiconductor fin, and the gate layer is formed on the interfacial layer.

17. The method of claim 13, further comprising removing a portion of the sacrificial layer on at least one sidewall of the insulation structure.

18. The method of claim 17, further comprising:
prior to removing the portion of the sacrificial layer, removing the gate layer to expose the portion of the sacrificial layer; and
after removing the portion of the sacrificial layer, forming a gate stack covering the first semiconductor fin and in contact with the at least one sidewall of the insulating structure.

19. The method of claim 13, further comprising forming a pair of gate spacers on opposite sidewalls of the gate layer, wherein forming the opening is such that the opening is between the pair of gate spacers.

20. The method of claim 13, wherein forming the opening is performed to expose an isolation structure adjacent to the first semiconductor fin and the second semiconductor fin.

* * * * *